United States Patent [19]
Kundert

[11] Patent Number: 5,859,785
[45] Date of Patent: *Jan. 12, 1999

[54] METHOD AND APPARATUS FOR A SIMPLIFIED SYSTEM SIMULATION DESCRIPTION

[75] Inventor: Kenneth S. Kundert, Belmont, Calif.

[73] Assignee: Cadence Design Systems, Inc., San Jose, Calif.

[*] Notice: The term of this patent shall not extend beyond the expiration date of Pat. No. 5,812,431.

[21] Appl. No.: 974,439

[22] Filed: Nov. 20, 1997

Related U.S. Application Data

[63] Continuation of Ser. No. 258,951, Jun. 13, 1994.

[51] Int. Cl.⁶ .................................................... G06F 17/50
[52] U.S. Cl. ......................... 364/578; 364/488; 395/500
[58] Field of Search ................................... 364/578, 488; 395/500

[56] References Cited

U.S. PATENT DOCUMENTS

| | | | |
|---|---|---|---|
| 5,363,320 | 11/1994 | Boyle et al. | 364/578 |
| 5,392,227 | 2/1995 | Hiserote | 364/578 |
| 5,416,717 | 5/1995 | Miyama et al. | 364/488 |
| 5,461,579 | 10/1995 | Tsay et al. | 364/490 |
| 5,477,474 | 12/1995 | Southgate et al. | 364/578 |
| 5,481,484 | 1/1996 | Ogawa et al. | 364/578 |
| 5,493,507 | 2/1996 | Shinde et al. | 364/578 |
| 5,499,192 | 3/1996 | Knapp et al. | 364/489 |

*Primary Examiner*—Kevin J. Teska
*Assistant Examiner*—Tyrone V. Walker
*Attorney, Agent, or Firm*—Charles E. Gotlieb; Law Offices of Charles E. Gotlieb

[57] ABSTRACT

A method and apparatus simulates the performance of a system from a user-specified description of the components in the system and the interconnections between the components. The user may specify the descriptions using a consistent syntax. Conservation relations are automatically generated using the description of the components, the interconnections between the components in the system, or both. The description provided by the user and the conservation requirements generated may be translated into models for use by a conventional simulator to complete the simulation. Alternately the description and the conservation relation may be formulated into a set of relations and solved using conventional methods, such as Modified Nodal or Sparce Tableau. System performance simulation information is then generated as desired by a user.

51 Claims, 6 Drawing Sheets

METHOD AND APPARATUS FOR A SIMPLIFIED SYSTEM SIMULATION DESCRIPTION

CROSS REFERENCE TO RELATED APPLICATIONS

This application is a continuation of copending application Ser. No. 08/258,951 entitled, "Method and Apparatus for a Simplified System Simulation Description" filed on Jun. 13, 1994 by Kenneth S. Kundert and having the same assignee as this application, and is related to application Ser. No. 08/137,842 filed by Daniel Fitzpatrick and Kenneth S. Kundert on Oct. 15, 1993, now abandoned, each having the same assignee as this application and each is incorporated herein by reference in its entirety.

FIELD OF THE INVENTION

This invention relates to system simulators, and more specifically to the generation of conservation requirements in a system simulator.

BACKGROUND OF THE INVENTION

System simulators allow a user to model a system to determine one or more responses to one or more stimuli. This capability allows a system designer to develop an understanding of the behavior of the system before it is constructed.

The user of a conventional simulator such as the MAST simulator from Analogy Corporation of Beaverton Oreg., the conventional SPICE simulator or other simulators related to the SPICE simulator typically describes a system to the system simulator using a modeling language. This modeling language allows the user to describe to the simulator the structural description of the system to be simulated, and a behavioral description of each component in the system. The structural description of the system, sometimes called a "netlist," is a list of all the components in the system, along with information about how the components are interconnected.

The user typically provides the behavioral description of each component using a set of relations which describe the behavior of the component. In some simulators such as MAST, these relations are in the form of equations. To describe a system that observes laws of conservation, such as Kirchhoff's laws in electrical systems or Newton's laws of motion in mechanical systems, the user of a simulator that employs a low-level behavioral language must also specify relations or equations consistent with the appropriate conservation requirements. For example, in an electrical system obeying the laws of conservation, the user must specify, for every node in the system, that the sum of currents into the node is equal to zero, or that the current into a branch is equal to the current out of the branch. The process of specifying these relations can be quite cumbersome, and is prone to error.

The user of the conventional SPICE simulator is not required to enter conservation relations into the simulator, but this simplicity comes at the expense of flexibility. The SPICE simulator does not allow the user to describe the behavior of a component using relations, limiting the user to the component definitions supplied with the simulator. The user of SPICE may vary certain component parameters, but may not alter existing definitions or create new ones.

It is believed that no currently available conventional system simulator provides the convenience of elimination of the requirement to explicitly specify the conservation relations while providing the flexibility to create or alter component definitions.

Another aspect of other simulators that makes them cumbersome to use is the method of specifying the relations. As described below, a user of a simulator specifies the behavior of a system by specifying the behavior of flows and potentials. The user of a simulator that employs a low-level behavioral language uses one syntax to specify a flow, and another syntax to specify a potential, requiring the user to remember to use the proper syntax. For example, to specify a flow "i" through a conductor having terminals "p" and "n", a user might write the relation as:

$$i(p \rightarrow n) = G(V(p) - V(n))$$

however, to specify a potential, V, the user must first specify a flow in and a flow out, and then tell the simulator to solve for the flow that is equal to a function of a potential. For example, to specify a potential across two nodes "p" and "n" of a resistor having resistance r,:

i(p)+=i
i(n)-=i
i: V(p)-V(n)=r*i

Simulators which use inconsistent specification techniques are difficult for a user to learn and time consuming to use. It is believed that no currently available simulator provides a consistent specification technique for flows and potentials.

SUMMARY OF INVENTION

In accordance with the present invention, a method and apparatus simulates a system without requiring the user to specify conservation requirements. The user is allowed to define or alter the characteristics of components in the system, and describe how the components are connected, using a consistent syntax to specify flows and potentials. The method and apparatus generates the conservation requirements for the system to be simulated, freeing the user from the time consuming, error-prone task of specifying the conservation requirements of a system. The system is then simulated using conventional methods.

DETAILED DESCRIPTION OF A PREFERRED EMBODIMENT

System simulators are used to simulate a wide variety of systems to determine or verify one or more responses to one or more stimuli. Some simulators are designed to simulate a specific type of system. For example, the conventional SPICE simulator was designed to simulate electrical systems. Other simulators are designed for more than one type of system, including electrical, mechanical, fluidic, optical, chemical, or biological.

The present invention applies to any type of system which uses conservation rules, such as Kirchhoff's laws in electrical systems, or Newton's laws of motion in mechanical systems. For example, Kirchhoff's Potential Law states that the sum of all potentials around a loop at any instant is zero. Kirchhoff's Flow Law states that the sum of all flows into a closed surface at any instant is zero.

To simulate a system, the user of the simulator typically describes the system including the stimuli. This description typically includes a description of the components, and a description of how the components are interconnected. The simulator then determines responses to the stimuli by the system described. The simulator may provide to the user only the responses specified by the user, or the simulator may determine the response values of many components.

Figure 1A:
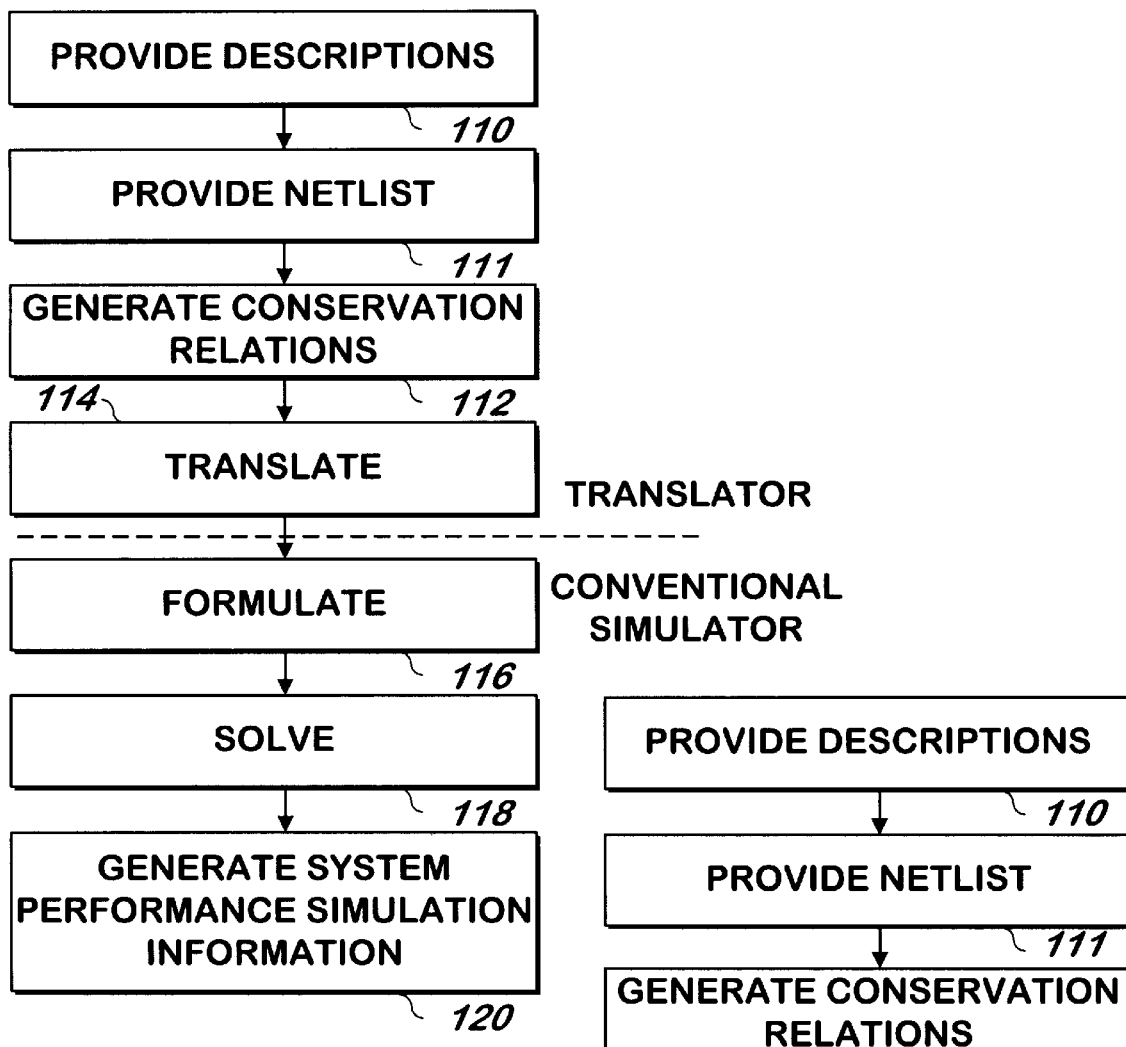
FIG. 1A is a flow chart illustrating a method of the present invention used to translate descriptions into conventional simulator models.

Referring now to FIG. 1A, one embodiment of a method of the present invention is shown. One or more component descriptions are provided to the simulator 110. A component may be a conventional component, such as a resistor, current source, diode, or capacitor, or the user may define an entirely new component. To provide the descriptions, the user may indicate an identifier corresponding to a component having a description in a library. The library stores a set of descriptions which have been pre-defined by the manufacturer of the simulator or by earlier users. Alternately, the user may define his own component descriptions using an input device, such as a conventional computer terminal.

In one embodiment, a component description is called a "module," and contains the name of the component, and names the nodes or terminals which will attach the component to other parts of the system. The user may also include parameters as part of the definition, to allow the definition to be modified or duplicated for use by similar components. For example, the first portion of the definition of a current source would read:
module isource (src sink)
parameter real dc:
This module definition names the module "isource," and defines and names two nodes, "src" and "sink." The module is specified to allow one parameter, dc, used below to specify the current value of isource. The use of a parameter allows a definition of a component to be reused as described below, even with a different value for the parameter, without the need to provide a completely new component description.

Each component definition also includes at least one branch definition to define the characteristics of each connection between at least two nodes. For example, to continue the isource definition from above:
branch B from src to sink:

$$I(B) = dc; \quad \text{(Eq. 1)}$$

This branch definition names the branch "B" and states it runs between nodes src and sink. A current source generally has only one branch, but other components, such as transistors, will have several branches corresponding to that component.

The branch description also contains at least one branch relation. In one embodiment, a branch relation is specified in the form of an equation and describes the behavior of the branch. For example:

$$I(B) = dc \quad \text{(Eq. 2)}$$

| Component | Equation | |
|---|---|---|
| conductor | I(B) = G * V(B) | (Eq. 3) |
| resistor | V(B) = R * I(B) | (Eq. 4) |
| capacitor | I(B) = C * dot (V(B)) | (Eq. 5) |
| inductor | V(B) = L * dot (I(B)) | (Eq. 6) |
| voltage controlled current source (vccs) | I(B) = gm * V(BZ) | (Eq. 7) |
| diode | I(B) = is * area * exp(V(B)/$V_T$ − 1) | (Eq. 8) |

In one embodiment of the present invention, these relations may be provided as a function of a flow, a potential, or a flow and a potential. For example, in Equation 4, the behavior of the resistor is described in terms of a flow, current. In one embodiment, the user specifies potentials and flows using a consistent syntax. For example, Equation 3 specifies a current and Equation 4 specifies a voltage, yet the syntax of each specification is similar.

Some component relations may be conditional, applying only in response to one or more variables. For example, an ideal diode has a voltage equal to zero when the current through the diode is non-negative, and a current equal to zero when the applied voltage is negative. Thus, more than one relation may be necessary to specify the behavior of a component. Each conditional relation may specify a flow, a potential, or a flow and a potential, independent of the other relations for the component. For example, one conditional relation for the ideal diode specifies a potential, and the other conditional relation specifies a flow.

For example:

| If | (V(a,c) + I(a,c) > 0) | |
|---|---|---|
| | V(a,c) <−0; | (Eq. 9) |
| else | | |
| | I(a,c) <−0; | (Eq. 10) |

In one embodiment, a component definition may have multiple branches, allowing the user to model components having nearly any complex internal topology. For example, to model a series RLC circuit, which consists of a pure resistor connected in series to a pure inductor connected in series to a pure capacitor:

```
module rlc (p, n) (R, L, C)
node [V,I] p, n
real R, L, C
{
    node[V,I]int1, int2;
    branch res from p to int1;
    branch ind from int1 to int2;
    branch cap from int2 to n;
    analog {
        V(res) <- R*I(res);                    (Eq. 11)
        V(ind) <- L*dot(I(ind));               (Eq. 12)
        I(cap) <- C*dot(V(cap));               (Eq. 13)
    }
}
```

The definition of the internal nodes int1 and int2, allows the user to connect in series the three ideal components to each other by the declaration, naming, and definition of three branches, res, ind, and cap. Three relations define the characteristics of the three branches. Using this technique, a user can define highly complex component behavior in a straightforward manner.

Figure 2A:
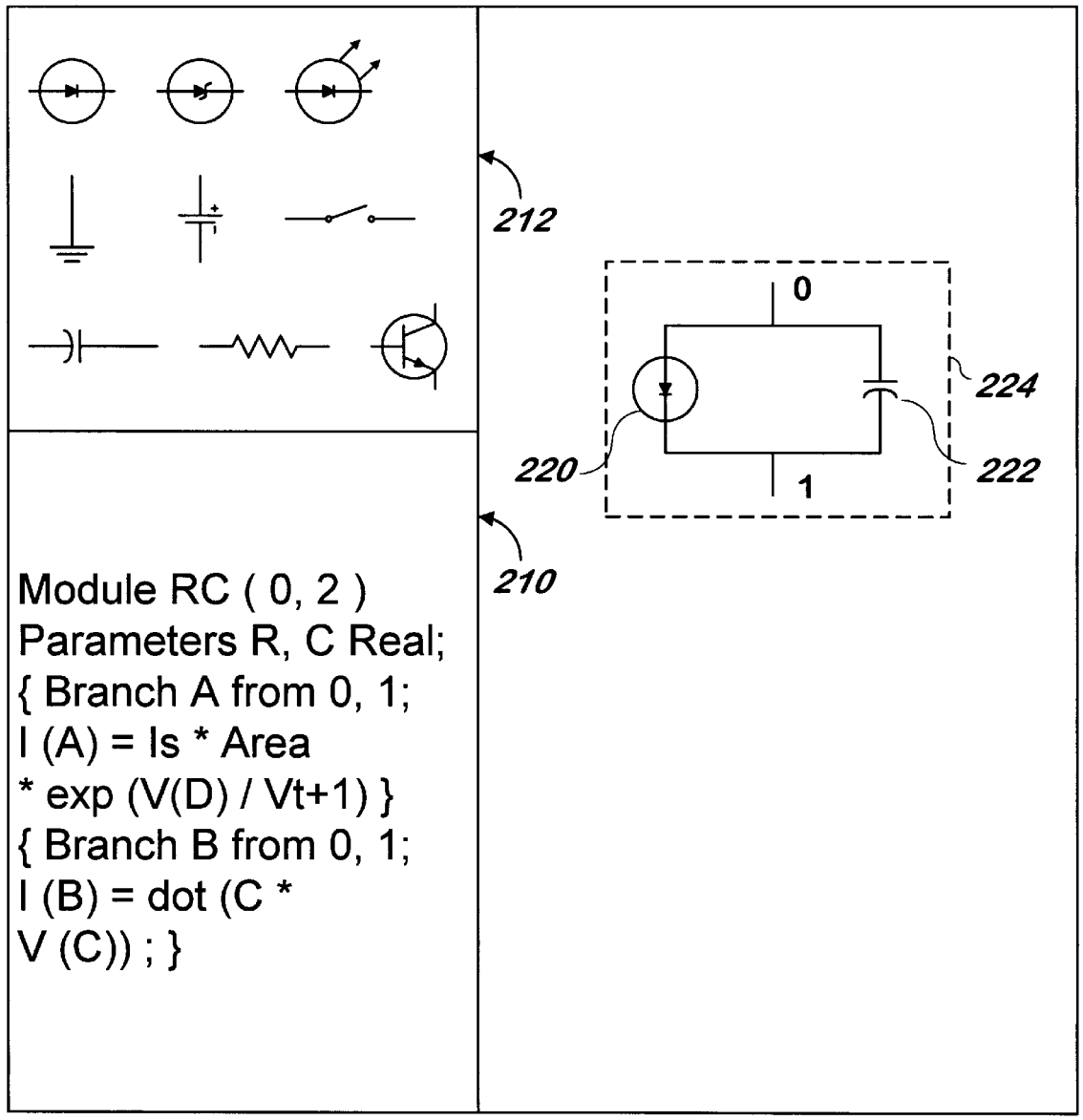
FIG. 2A is a diagram illustrating a computer screen for graphically defining a system.

In one embodiment, component descriptions may also be defined in terms of other component descriptions. When several components are combined to form a network, the description may use a hierarchical structure allowing a user to define a component using previously defined definitions of components. Referring now to FIG. 2A, a user could define a diode 220 and capacitor 222 as independent components, and then combine them to form a third component, a diode-capacitor network 224. The network definition could be used as a component. Where a network consisting of multiple elemental components, such as a diode and a capacitor, is replicated many times in a network, this hierarchical structure can save the user from having to duplicate the effort required to design this third branch. The SPICE simulator previously discussed uses this approach.

Figure 2B:
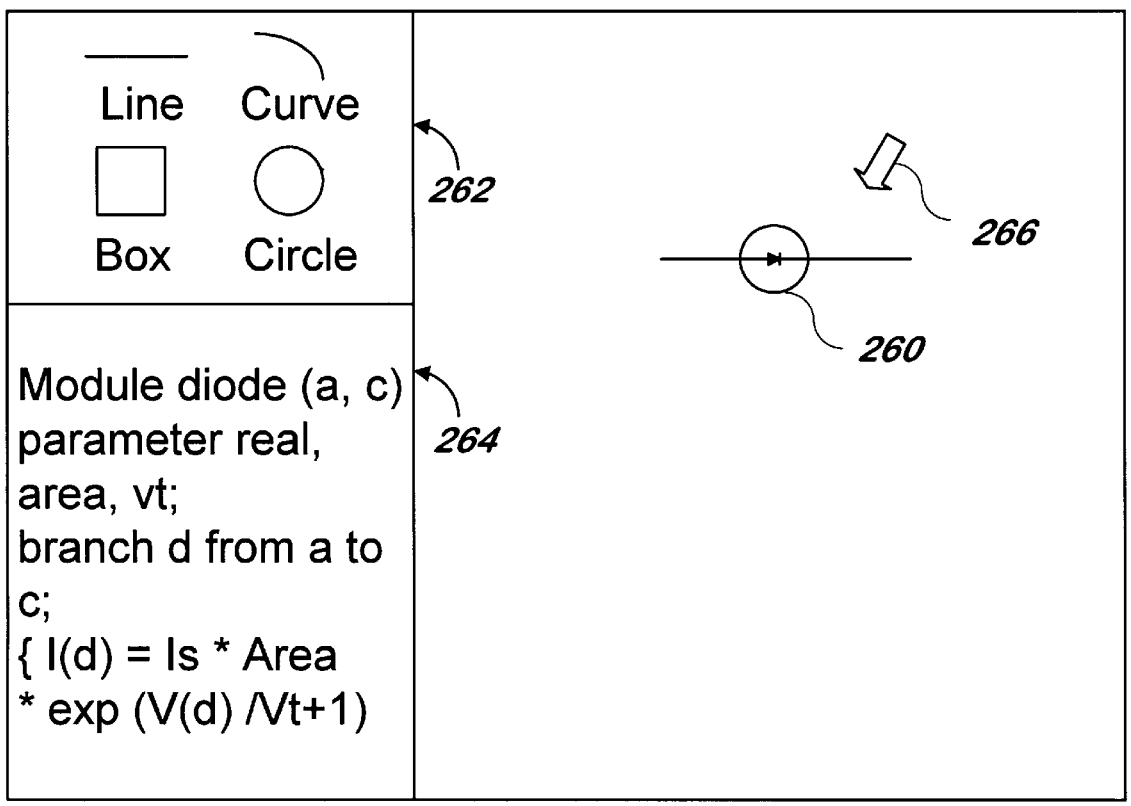
FIG. 2B is a diagram illustrating a computer screen for graphically defining a component.

One embodiment allows the user to define a network graphically. Referring momentarily to FIG. 2B, elementary components such as a diode 260 may be pre-defined by drawing an icon 260 using a cursor 266 and drawing aids 262 and entering the component definition 264. The user may also define new components in the same manner. Referring now to FIG. 2A, using a graphical interface, the user may graphically select these defined components from icons of the components 212 to form a network 224, or networks. The interface generates the definition 210 of the network 224 either identical in form to that of one or more component definitions described above, or in an internal format described below.

In one embodiment of the present invention, the user need not specify any explicit conservation relations for any of the branches in the component descriptions. Other embodiments may allow the user to specify conservation relations for some or all of the component descriptions. Examples of explicit conservation relations are $$i(src)+=dc \qquad \text{(Eq. 14)}$$

$$i(sink)-=dc \qquad \text{(Eq. 15)}$$

to indicate the current into the branch between src and sink is equal to the current out of the branch. Providing explicit conservation relations in a branch description is described below as unnecessary, as the present invention has the capability described below to generate conservation relations. However, the existence of explicit conservation relations will not interfere with the present invention.

Figure 3A:
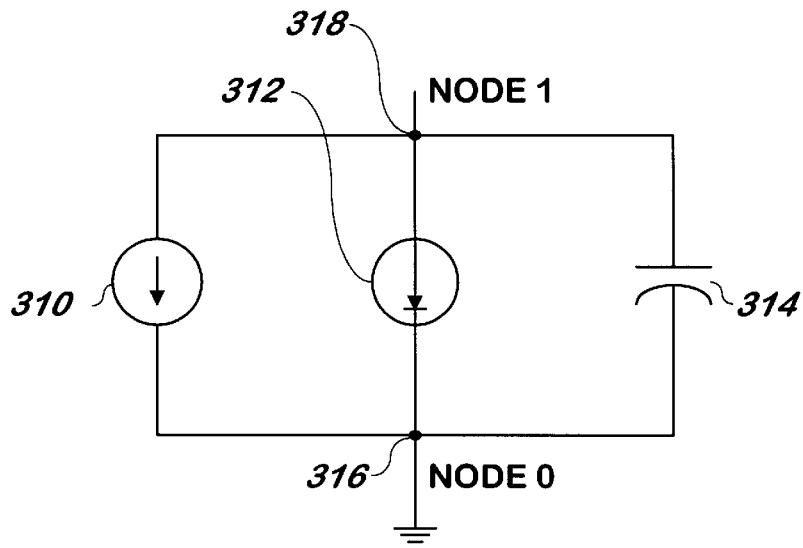
FIG. 3A is a schematic diagram illustrating a circuit to be simulated.
Figure 3B:
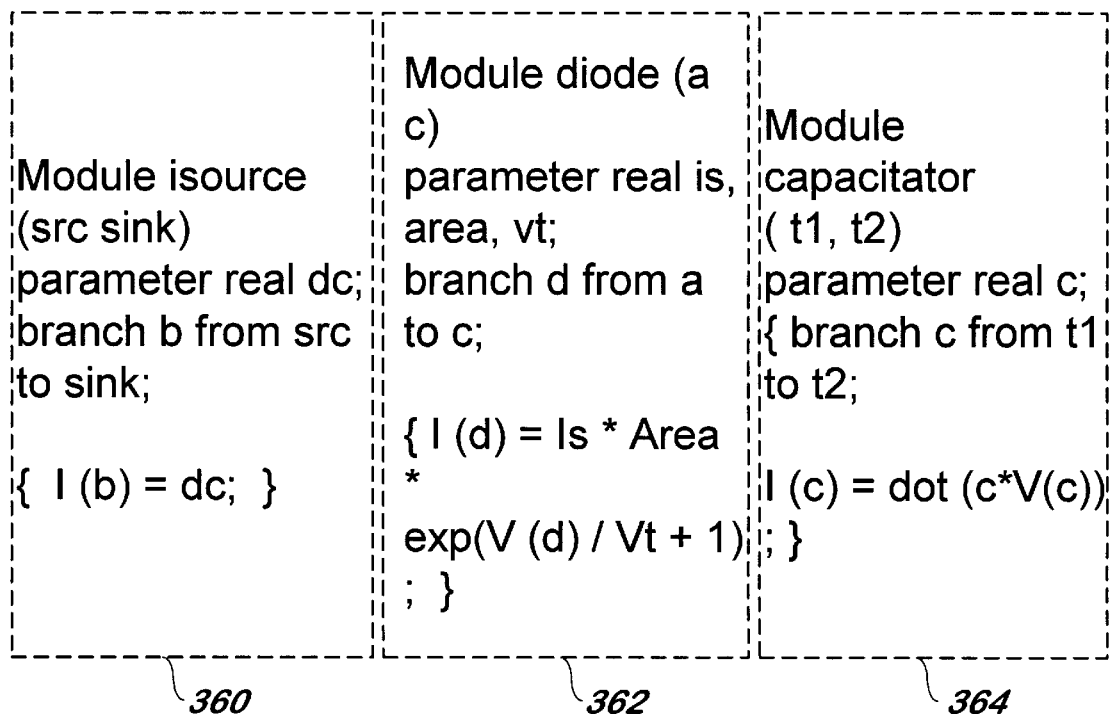
FIG. 3B is a sample set of component descriptions corresponding to the components in the circuit of FIG. 3A.

Referring now to FIGS. 3A and 3B, a network containing a current source 310, diode 312 and capacitor 314 is shown along with the corresponding component descriptions 360, 362, 364. Conservation relations, such as those specified in Equations 14 and 15, are not explicitly stated in these descriptions 360, 362, 364.

Referring now to FIG. 1A, in one embodiment, the user also indicates the physical structure of the system using a netlist 111. The netlist allows the user to indicate how the components are physically tied together in the model. Referring now to FIG. 3A, the user would specify that diode 312, current source 310 and capacitor 314 are joined at each node. In one embodiment, the user makes this specification by providing an equation to indicate the voltage across one component 310 is equal to the voltage across the others 312, 314. Other specification techniques are also possible, including a graphical user interface allowing the representations of the components to be graphically joined, or a command based interface, such as "Join src to a, join a to t1." In these latter two techniques, the simulator may generate the corresponding connection relations. Another embodiment allows user or the simulator to number each node 316, 318 and then specify the connections in a tabular form, such as:

| Instance Name | Nodes | | Component Name | Parameter |
|---|---|---|---|---|
| I1 | 1 | 0 | isource | 1.0 |
| D1 | 1 | 0 | diode | 0.1, 1, 0.7 |
| C1 | 1 | 0 | capacitor | 0.5 | for the network shown in FIG. 3A.

Referring now to FIG. 1A, in one embodiment, using the netlist specified by the user, conservation relations for the system are generated 112. Another embodiment uses the component descriptions to generate 112 the conservation relations. Another embodiment uses both the netlist and the component descriptions to generate 112 the conservation relations. Generating conservation relations is accomplished in one embodiment by specifying the sum of the flows into a node or branch is equal to the sum of the flow out of the node or branch. Where flows into a node or branch are considered positive, and flows out of the node or branch are considered negative, another way of stating the conservation relation is that the sum of the flows into a node or branch are equal to zero. For example, the simulator would generate for the network of FIGS. 3A and 3B:

$$I(I1: sink)+I(D1:a)+I(C1:t1)=0 \qquad \text{(Eq. 16)}$$

Once the conservation relations have been generated, all of the information required by a conventional simulator which expected any conservation requirements to be provided to it rather than generated by it, is available. Therefore, one of several basic approaches may be used to complete the method. The first approach utilizes a conventional simulator without alteration. Referring now to FIG. 1A, if it is desirable to use a conventional simulator, the information from the descriptions, netlist, and conservation relations may be translated 114 into a format or model that a conventional simulator can use. This embodiment may be desirable where one does not have access to the source code of the conventional simulator, or where modification of the conventional simulator source code would be too lengthy and cumbersome. The model into which the information is translated can include descriptive information, such as the branch relations and conservation relations described above, as well as structural information such as the netlist outlined above.

Another approach is to translate the information into one of the formulation formats, described below, which may be used internally by a variety of conventional simulators.

In addition, the information may be translated into programming languages, such as C, C++, Fortran, or even assembly language, or machine language where the models must be programmed into the simulator because the simulator has no formal modeling language.

Once the information has been translated by the method of the present invention, the method continues. Information from the branch and conservation relations and the netlist is formulated 116 into a set of relations.

The set of relations may be built using such conventional formulation methods such as Modified Nodal, MESH, Cut set, Loop, state equation, Sparse Tableau or other formulation methods. Modified Nodal analysis or Sparse Tableau are the preferred methods and are used in conventional simulators. These methods are described, for example, in Chua, Desoer, and Kuh, *Linear and Nonlinear Circuits* (McGraw-Hill, 1987). Modified Nodal Analysis is a preferred method of solution and is also a widely used method of analysis in conventional simulators.

Using Modified Nodal formulation, the relations of the component definitions of FIG. 3B would be substituted into Equation 16 to yield:

$$dc + is^* area^* [exp(V_1/V_t) - 1] + dot\ (C^* V_1) = 0 \quad \text{(Eq. 17)}$$

where $V_1$ is the voltage from node 1 to node 0.

The set of relations is solved 118 using conventional solution methods of discretizing, linearizing and decomposing, each described below.

Because Equation 17 contains a derivative, it must be integrated prior to solving. Descretizing uses an integral approximation technique, such as numeric integration as described, for example, in Leon O. Chua, Pen-Min Lin *Computer-Aided Analysis of Electronic Circuits: Algorithms and Computational Techniques* (Prentice-Hall, 1975), or harmonic balance described in Kenneth S. Kundert, Jacob K. White, Alberto Sangiovanni-Vincentelli, *Steady State Methods for Simulating Analog and Microwave Methods* (Kluwer Academic Publishers, 1990) to integrate Equation 17. Applying the backward-Euler technique described in Chua above gives:

$$0 = dc + is^* area^* (exp(V_1(t_k)/V_t) - 1) + (C/\Delta t) + [V_1(t_k) - V_1(t_{k-1})] \quad \text{(Eq. 18)}$$

Equation 18 would be solved for $V_1$ at $t_k$ where $t_k$ starts at 0, the start time and steps up to T, the stop time defined by the user.

The Newton-Raphson method solves $f(x)=0$ for x, using linearization, which iteratively solves the equation:

$$x^{(j)} = x^{(j-1)} - df/dx(f(x^{j-1})) \quad \text{(Eq. 19)}$$

The technique begins with an initial value such as 0 for $x^{(0)}$. $x^{(j)}$ is calculated, j is incremented, and $x^{(j)}$ is recalculated until $x^{(j)}$ converges. Thus, Equation 18 is substituted into Equation 19 to read:

$$V_1^{(j)}(t_k) = V_1^{(j-1)}(t_k) - [((is * area)/V_t) * exp(V_1^{(j-1)}(t_k)/V_t) + \quad \text{(Eq. 20)}$$
$$C/\Delta t] * [dc + is * area * (exp(V_1^{(j-1)}(t_k)/V_t) - 1) +$$
$$(C/\Delta t) * (V_1^{(j-1)}(t_k) - V_1(t_{k-1}))].$$

Newton-Raphson techniques are described more fully in J. M. Otega, W. C. Rheinboldt, *Iterative Solutions of Nonlinear Equations in Several Variables* (Academic Press, 1970).

In a complex network of more than two nodes, formulation, discretization, and linearization will generate a system of equations instead of one Equation 20. Decomposition solves the system of equations. The system of equations is solved using conventional elimination techniques, such as Gaussian elimination, relaxation, or other standard linear algebraic techniques. Examples of such techniques are described, for example, in Strang, *Linear Algebra and it Applications* (Academic Press, 1980).

The solution is then used to generate 120 an output which may include values in numeric form, or graphical information for display to the user via a terminal, printer, or other such output device. In one embodiment, the solution itself is presented to the user as the output. In one embodiment, the output is presented to the user by generating signals which may be read by a conventional computer screen.

Figure 1B:
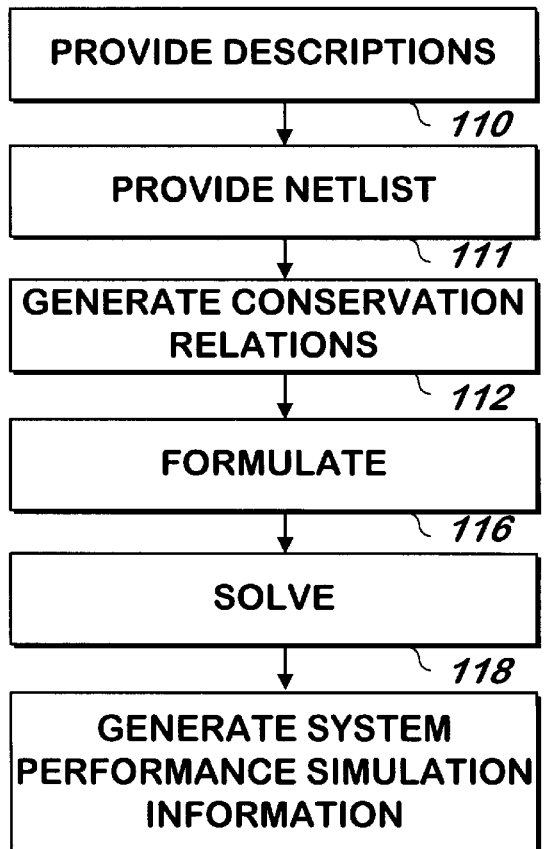
FIG. 1B is a flow chart illustrating a method of the present invention used where translation into conventional simulator models is not required.

Rather than translate the descriptions, conservation relations, and structural information into models for use in a conventional simulator as described above, the translate step 114, and the formulate step 116 may be merged into a single step which arranges the information directly into the set of relations, such as Equation 17, to be solved. To use this approach in a conventional simulator, some simplification or modification of the simulator is required, such as removing the internal translation of the modeling language of the simulator, and thus, and may represent a minimal amount of effort. Such simplification or modification can produce a potential performance improvement over approaches which first perform a translation into a model, and then perform a separate formulation step as described above. A simulator which was originally designed to use the method of the present invention may similarly not require such an interim translation into a model. Referring now to FIG. 1B, the steps of FIG. 1A are shown with the translation step removed.

One embodiment of the method of the present invention includes the step 115 of eliminating unnecessary relations or equations. An equation may be unnecessary if two conditions are satisfied. First, it must be possible to symbolically eliminate the "unnecessary" equation by combining it into another equation or relation. For example, the equations:

$$I_p = I_G \quad \text{(Eq. 21)}$$
$$I_n = -I_G \quad \text{(Eq. 22)}$$
$$0 = GV_p - GV_n - I_G \quad \text{(Eq. 23)}$$

may be represented by the equations $$I_p = GV_p - GV_n \quad \text{(Eq. 24)}$$
$$I_n = GV_n - GV_p \quad \text{(Eq. 25)}$$

by solving for $I_G$ in Equation 23 and substituting into Equations 21 and 22.

A second condition required to make an equation unnecessary is that other equations are adequate to solve for a particular variable of interest. The equation may be eliminated where elimination will remove at least one variable, provided the variable removed is not required for an internal calculation and the user is not interested in the variable. For example, to solve for $I_G$ in Equations 21, 22 and 23, Equation 23 is unnecessary and may be eliminated where $I_p$ or $I_n$ is known, because elimination of Equation 23 eliminates the variable $I_G$ which is assumed to be of no interest for the purposes of this example.

Figure 1C:
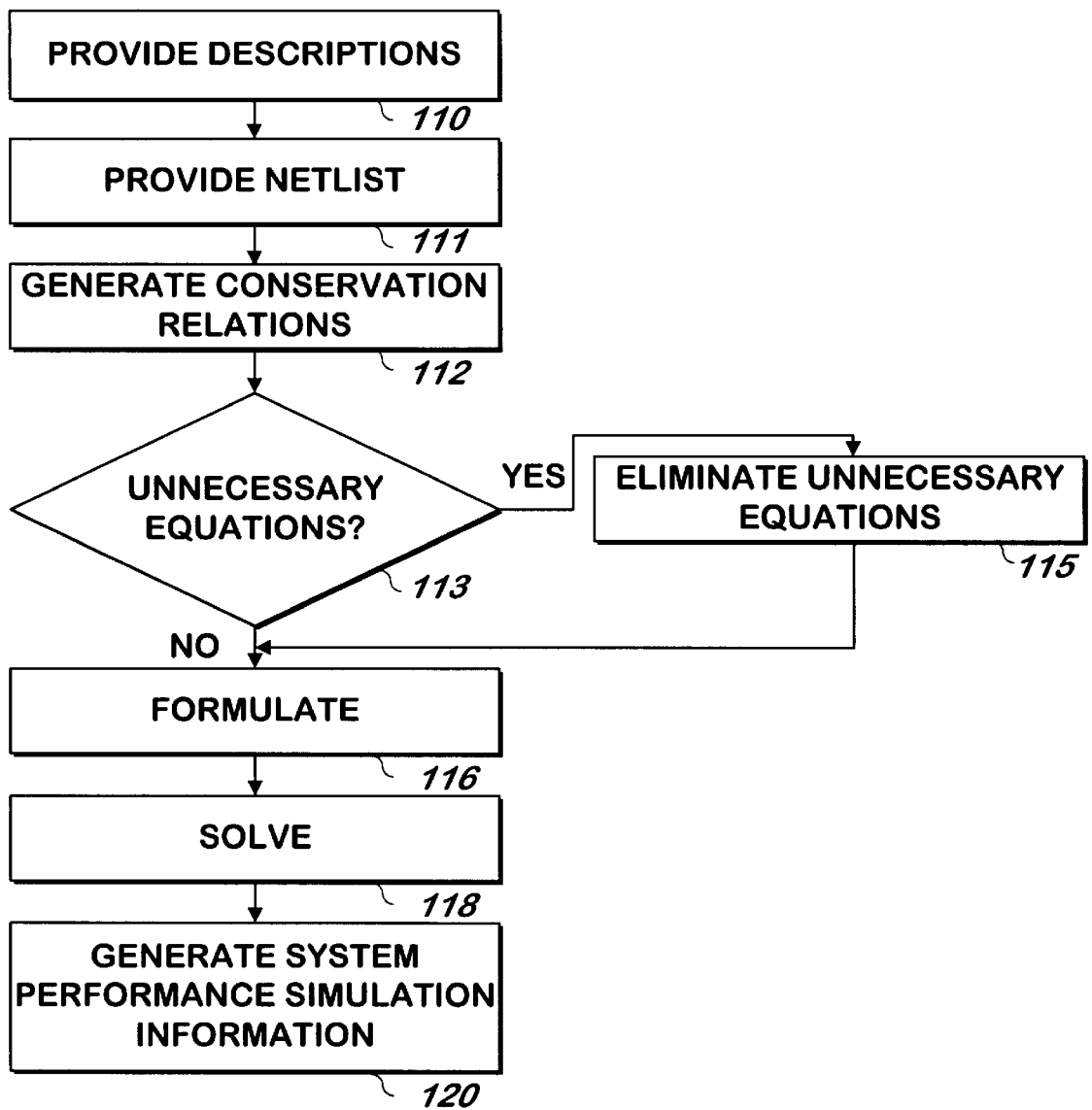
FIG. 1C is a flow chart illustrating a method of the present invention including a step for eliminating unnecessary equations.

Eliminating unnecessary equations may be performed at many stages in the method. Referring now to FIG. 1C, one embodiment performs these steps 113, 115 prior to the formulate step 116.

In one embodiment, the processes of formulating the set of relations and eliminating unnecessary relations uses the method described in copending application Ser. No. 08/137, 842 filed Oct. 15, 1993 and having the same assignee. That document is hereby incorporated by reference.

Figure 4:
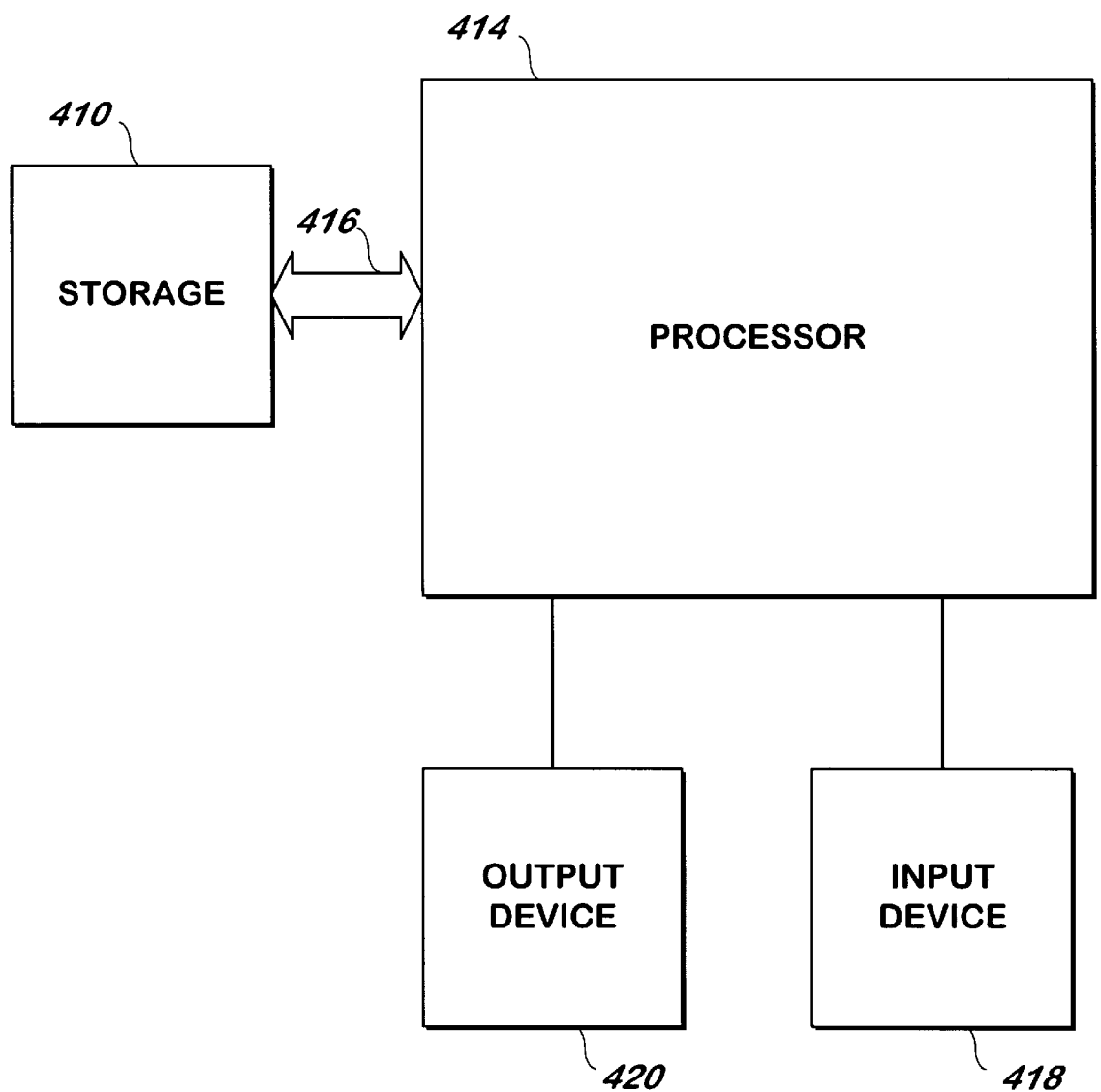
FIG. 4 is a block schematic diagram illustrating the apparatus of the present invention.

Referring now to FIG. 4, there is shown a block diagram of the apparatus according to one embodiment of the present invention. A storage module 410, such as a magnetic disk, semiconductor memory, or a combination of the two, such as the memory and disks used by a conventional 486 personal computer, stores information including component descriptions and netlists, described above. The component descriptions and netlists may be provided by a user via an input device such as a computer terminal 418, or they may be provided as data supplied on a magnetic disk by another source, such as a manufacturer of the simulator.

A processor module 414, such as a conventional 486 personal computer, is provided to perform several functions. The processor reads from the storage module 410 via a bus 416 the component descriptions indicated by the user. A component description may have been predefined by another party, or defined by the user using a terminal 418 to input the component descriptions into the storage module 410 via the processor module 414. The processor module 414 also reads a netlist, described above, of the system to be modeled. The netlist is stored in the storage module 410, having been predefined or supplied by the user using a computer terminal 418.

Using either the netlist, the component description, or both, the processor module 414 then generates a set of relations such as Equation 16 which provide the conservation requirements for the system as described above.

The processor module 414 then typically formulates information from the descriptions, conservation relations, and the netlist into set of relations and then solves them as described above. The processor then generates simulation information as described above, for output to a printer, terminal, or other output device 420.

I claim:

1. A method of simulating a system, comprising:
   receiving at least one component description including at least one branch relation, at least one of the component descriptions comprising:
     a first branch relation contribution describing a first value of a first variable, the first value comprising a first function; and
     a second branch relation contribution describing a second value of the first variable, the second value comprising a second function;
   for each of at least one component description received, formulating a third branch relation describing a third value of the first variable, the third value comprising the first function and the second function;
   formulating a set of relations from at least one said branch relation including at least one said third branch relation;
   solving the set of relations formulated; and
   generating a set of system performance simulation information from the solved set of relations.

2. The method of claim 1 wherein:
   the system comprises at least one branch comprising at least one portion; and
   each of the portions of the branches of the system corresponds to not more than one of the branch relations received.

3. The method of claim 2 wherein each of the portions of the branches of the system is described by not more than one of the branch relations received.

4. The method of claim 1 wherein none of the component descriptions received comprises a conservation relation.

5. The method of claim 1 wherein at least one of the component descriptions received comprises at least one conservation relation.

6. The method of claim 1 additionally comprising the step of receiving at least one conservation relation.

7. The method of claim 1 wherein at least one of the branch relations received comprises an operator indicating an assignment.

8. The method of claim 7 wherein all of the branch relations received comprise at least one operator indicating an assignment.

9. The method of claim 1 wherein at least one branch relation received comprises a plurality of statements, each of at least a plurality of the plurality of statements of the branch relation comprising less than all of the branch relation, all of a plurality of the plurality of statements comprising a branch relation.

10. The method of claim 9, wherein a plurality of the statements assign different values to one identifier, the method comprising the additional step of accumulating the different values for the identifier.

11. The method of claim 1, wherein the system comprises at least one portion of at least one branch, and at least one of the component descriptions comprises a name of at least one of the portions of the at least one branch.

12. The method of claim 11 wherein the system comprises at least one signal, and at least one of the component descriptions comprises a name of at least one of the at least one signal.

13. The method of claim 11, wherein zero of the branch relations is associated with a label comprising a name of a portion of a branch of the system.

14. The method of claim 11, wherein:
   at least one third branch relation received specifies at least one source;
   at least one fourth branch relation received specifies at least one probe; and
   a syntax of the at least one third branch relation is substantially the same as a syntax of the at least one fourth branch relation.

15. The method of claim 11, wherein:
   at least one third branch relation received specifies at least one voltage source; at least one fourth branch relation received specifies at least one current source; and
   a syntax of the at least one third branch relation is substantially the same as a syntax of the at least one fourth branch relation.

16. The method of claim 1, wherein:
   at least one third branch relation received specifies at least one voltage probe;
   at least one fourth branch relation received specifies at least one current probe; and
   a syntax of the at least one third branch relation is substantially the same as a syntax of the at least one fourth branch relation.

17. The method of claim 1 wherein each of the first branch relations and second branch relations is received using a consistent syntax.

18. The method of claim 1 comprising the additional step of assembling at least one model corresponding to at least one selected from at least one first branch relation and at least one second branch relation.

19. The method of claim 18 wherein assembling the model comprises assembling the set of relations in a specified language.

20. The method of claim 19 wherein the specified language is a language suitable for providing input to a simulator.

21. The method of claim 19 wherein the specified language is a general purpose computer programming language.

22. The method of claim 1 wherein the formulating step comprises assembling the set of relations in a Modified Nodal format.

23. The method of claim 22 wherein the assembling step comprises assembling the set of relations in a Sparse Tableau format.

24. The method of claim 1 wherein at least one selected from at least one first branch relation and at least one second branch relation specifies a flow of a branch.

25. The method of claim 1 wherein at least one selected from at least one first branch relation and at least one second branch relation comprises a function of at least one flow.

26. The method of claim 1 wherein at least one selected from at least one first branch relation and at least one second branch relation specifies a branch potential.

27. The method of claim 1 wherein at least one selected from at least one first branch relation and at least one second branch relation comprises a function of at least one potential.

28. The method of claim 1 wherein at least one selected from at least one first branch relation and at least one second branch relation relates at least one flow to at least one potential.

29. The method of claim 1 wherein at least one selected from at least one first branch relation and at least one second branch relation relates at least two potentials.

30. The method of claim 1 wherein at least one selected from at least one first branch relation and at least one second branch relation relates at least two flows.

31. The method of claim 1 wherein at least one selected from at least one first branch relation and at least one second branch relation is conditional.

32. The method of claim 1 comprising the additional step of determining whether at least one selected from at least one first branch relation and at least one second branch relation is necessary.

33. The method of claim 32 comprising the additional step of symbolically eliminating at least one selected from at least one first branch relation and at least one second branch relation thereby making said at least one branch relation unnecessary.

34. The method of claim 1 wherein at least one selected from at least one first branch relation and at least one second branch relation comprises an equation.

35. The method of claim 1 wherein at least one component description contains no explicit conservation relation.

36. The method of claim 1 wherein each component description comprises at least one selected from at least one first branch relation and at least one second branch relation.

37. A method of simulating system performance, the system comprising at least one branch comprising at least one portion, the method comprising the steps of:
receiving at least one component description including at least one branch relation;
generating at least one conservation relation;
formulating a set of relations from at least one said branch relation and at least one said conservation relation;
solving the set of relations formulated; and
generating a set of system performance simulation information from the solved set of relations; and wherein
each of the portions of the branches of the system corresponds to not more than one of the branch relations received.

38. The method of claim 37 wherein each of the portions of the branches of the system is described by not more than one of the branch relations received.

39. A method of simulating system performance, comprising the steps of:
receiving at least one component description including at least one branch relation;
generating at least one conservation relation;
formulating a set of relations from at least one said branch relation and at least one said conservation relation;
solving the set of relations formulated; and
generating a set of system Performance simulation information from the solved set of relations; and
wherein none of the component descriptions received comprises a conservation relation.

40. A method of simulating system performance, comprising the steps of:
receiving at least one component description including at least one branch relation;
generating at least one conservation relation;
formulating a set of relations from at least one said branch relation and at least one said conservation relation;
solving the set of relations formulated; and
generating a set of system performance simulation information from the solved set of relations; and
wherein at least one of the component descriptions received comprises at least one conservation relation.

41. A method of simulating system performance, comprising the steps of:
receiving at least one component description including at least one branch relation;
generating at least one conservation relation;
formulating a set of relations from at least one said branch relation and at least one said conservation relation;
solving the set of relations formulated;
generating a set of system performance simulation information from the solved set of relations; and
receiving at least one conservation relation.

42. A method of simulating system performance, comprising the steps of:
receiving at least one component description including at least one branch relation, at least one of the branch relations comprising an operator indicating an assignment,
generating at least one conservation relation:
formulating a set of relations from at least one said branch relation and at least one said conservation relation;
solving the set of relations formulated; and
generating a set of system performance simulation information from the solved set of relations.

43. The method of claim 42 wherein all of the branch relations received comprise at least one operator indicating an assignment.

44. A method of simulating system performance, comprising the steps of:
receiving at least one component description including at least one branch relation, at least one branch relation comprising a plurality of statements, each of at least a plurality of the plurality of statements of the branch relation comprising less than all of the branch relation, all of a plurality of the plurality of statements comprising a branch relations,
generating at least one conservation relation;
formulating a set of relations from at least one said branch relation and at least one said conservation relation;
solving the set of relations formulated; and
generating a set of system performance simulation information from the solved set of relations.

45. The method of claim 44, wherein a plurality of statements assign different values to one identifier, the method comprising the additional step of accumulating the different values for the identifier.

46. A method of simulating system performance, the system comprising at least one portion of at least one branch, the method comprising the steps of:
receiving at least one component description including at least one branch relation, at least one of the component descriptions comprising a name of at least one of the portions of the at least one branch;

generating at least one conservation relation;

formulating a set of relations from at least one said branch relation and at least one said conservation relation;

solving the set of relations formulated; and generating a set of system Performance simulation information from the solved set of relations.

47. A method of simulating system performance, the system comprising at least one signal, the method comprising the steps of:

receiving at least one component description including at least one branch relation, at least one of the component descriptions comprising a name of at least one of the at least one signal;

generating at least one conservation relation;

formulating a set of relations from at least one said branch relation and at least one said conservation relation;

solving the set of relations formulated; and generating a set of system performance simulation information from the solved set of relations.

48. A method of simulating system performance, comprising the steps of:

receiving at least one component description including at least one branch relation;

generating at least one conservation relation;

formulating a set of relations from at least one said branch relation and at least one said conservation relation;

solving the set of relations formulated; and generating a set of system performance simulation information from the solved set of relations; and wherein zero of the branch relations is associated with a label comprising a name of a portion of a branch of the system.

49. A method of simulating system performance, comprising the steps of:

receiving at least one component description including at least one branch relation;

generating at least one conservation relation;

formulating a set of relations from at least one said branch relation and at least one said conservation relation;

solving the set of relations formulated; and generating a set of system performance simulation information from the solved set of relations; and wherein:

at least one first branch relation received specifies at least one source;

at least one second branch relation received specifies at least one probe; and a syntax of the at least one first branch relation is substantially the same as a syntax of the at least one second branch relation.

50. A method of simulating system performance, comprising the steps of:

receiving at least one component description including at least one branch relation;

generating at least one conservation relation;

formulating a set of relations from at least one said branch relation and at least one said conservation relation;

solving the set of relations formulated; and generating a set of system performance simulation information from the solved set of relations; and wherein:

at least one first branch relation received specifies at least one voltage source;

at least one second branch relation received specifies at least one current source; and a syntax of the at least one first branch relation is substantially the same as a syntax of the at least one second branch relation.

51. A method of simulating system performance, comprising the steps of:

receiving at least one component description including at least one branch relation;

generating at least one conservation relation;

formulating a set of relations from at least one said branch relation and at least one said conservation relation;

solving the set of relations formulated; and generating a set of system performance simulation information from the solved set of relations; and wherein:

at least one first branch relation received specifies at least one voltage probe;

at least one second branch relation received specifies at least one current probe; and a syntax of the at least one first branch relation is substantially the same as a syntax of the at least one second branch relation.

* * * * *

UNITED STATES PATENT AND TRADEMARK OFFICE
CERTIFICATE OF CORRECTION

PATENT NO : 5,859,785
DATED : 1/12/99
INVENTOR(S): Kenneth S. Kundert

It is certified that error appears in the above-identified patent and that said Letters Patent is hereby corrected as shown below:

On claim 12, line 1, delete "11", and insert in place thereof --1,--.

On claim 13, line 1, delete "11", and insert in place thereof --1--.

On claim 14, line 1, delete "11", and insert in place thereof --1--.

On claim 15, line 1, delete "11", and insert in place thereof --1--.

On claim 39, line 9, delete "Performance", and insert in place thereof --performance--.

On claim 42, line 7, delete ":", and insert in place thereof --;--.

On claim 44, line 9, delete ",", and insert in place thereof --;--.

On claim 46, line 12, delete "Performance", and insert in place thereof --performance--.

Signed and Sealed this

Twenty-seventh Day of March, 2001

*Attest:*

NICHOLAS P. GODICI

*Attesting Officer*  *Acting Director of the United States Patent and Trademark Office*